US012712533B1

(12) United States Patent
Cicchiello

(10) Patent No.: US 12,712,533 B1
(45) Date of Patent: Aug. 18, 2026

(54) OSCILLATORS USING CARBON NANOTUBES

(71) Applicant: Northrop Grumman Systems Corporation, Falls Church, VA (US)

(72) Inventor: James M. Cicchiello, Fort Wayne, IN (US)

(73) Assignee: Northrop Grumman Systems Corporation, Falls Church, VA (US)

(*) Notice: Subject to any disclaimer, the term of this patent is extended or adjusted under 35 U.S.C. 154(b) by 0 days.

(21) Appl. No.: 19/188,069

(22) Filed: Apr. 24, 2025

(51) Int. Cl.
*H03B 5/18* (2006.01)
*H03K 3/353* (2006.01)
*H03K 17/687* (2006.01)

(52) U.S. Cl.
CPC ........... *H03K 3/353* (2013.01); *H03B 5/1829* (2013.01); *H03K 17/687* (2013.01)

(58) Field of Classification Search
CPC .. H03B 5/1805; H03B 5/1817; H03B 5/1823; H03B 5/1829; H03L 7/04; H03K 3/353; H03K 17/687
See application file for complete search history.

(56) References Cited

U.S. PATENT DOCUMENTS 6,803,840 B2 * 10/2004 Hunt .................... H03H 9/2463 977/932
2006/0197076 A1 * 9/2006 Adam .................... B82Y 10/00 257/25
2009/0315631 A1 * 12/2009 Ham ...................... B82Y 10/00 331/117 FE
2010/0214034 A1 * 8/2010 Peng ...................... B82Y 10/00 977/762
2010/0271003 A1 * 10/2010 Jensen ..................... H03D 3/34 324/76.49
2018/0224487 A1 * 8/2018 Tadokoro .................. H01P 1/18
2020/0382100 A1 * 12/2020 Tenne .................. H03H 3/0072

OTHER PUBLICATIONS

Saxcé et al., Millimeter-Wave CNT Based Resonant Cavity, 2019 IEEE MTT-S International Microwave Workshop Series on Advanced Materials and Processes for RF and THz Applications (IMWS-AMP), Germany, 2019, pp. 124-126. (Abstract Only) https://doi.org/10.1109/IMWS-AMP.2019.8880083.

* cited by examiner

*Primary Examiner* — Levi Gannon
(74) *Attorney, Agent, or Firm* — Dority & Manning, P.A.

(57) ABSTRACT

An oscillator outputs a stable oscillation. The oscillator includes an amplifier, a carbon nanotube (CNT), and a power supply. The CNT extends along a resonance axis. A first end of the CNT is disposed along the resonance axis such that the first end is open. A second end of the CNT is disposed along the resonance axis and be operably coupled to the amplifier. The CNT generates a stable oscillation in response to a voltage. The amplifier includes a super-lattice castellated field effect transistor (SLCFET). The power supply applies the voltage to the oscillator.

20 Claims, 3 Drawing Sheets

OSCILLATORS USING CARBON NANOTUBES

FIELD

The present disclosure relates generally to oscillators, and more particularly to oscillators that include carbon nanotubes (CNTs) and field effect transistors (FETs).

BACKGROUND

Oscillator circuits generate continuous, periodic wave signals without requiring an external input signal after startup. They achieve this by utilizing active components like transistors or operational amplifiers, combined with passive elements such as resistors, capacitors, and/or inductors, to create a feedback loop that sustains oscillations at a desired frequency. These circuits can be used in communication systems, signal processing, and frequency synthesis. By producing consistent wave signals, oscillators enable the operation of devices such as radio transmitters, clock generators in digital circuits, and radar systems, providing a foundation for modern electronics. Described herein are improvements to modern oscillators.

SUMMARY

Aspects and advantages of the present disclosure will be set forth in part in the following description, or may be obvious from the description, or may be learned through practice of the present disclosure.

In one embodiment, an oscillator can include an amplifier, a carbon nanotube (CNT), and a power supply. The CNT extends along a resonance axis. A first end of the CNT is disposed along the resonance axis such that the first end is open. A second end of the CNT is disposed along the resonance axis and be operably coupled to the amplifier. The CNT is configured to stabilize the oscillator by resonating at a particular (e.g., target) frequency. The amplifier includes a super-lattice castellated field effect transistor (SLCFET). The power supply is configured to apply a voltage to at least one of the first or second ends of the CNT.

In one embodiment, an oscillator includes an amplifier, a CNT extending along a resonance axis, and a power supply. A first end of the CNT is disposed along the resonance axis and is open. A second end of the CNT along the resonance axis is operably coupled to the amplifier. The CNT is configured to stabilize the oscillator by resonating at a particular frequency. The power supply is configured to apply a voltage to at least one of the first or second ends of the CNT.

In one embodiment, a method for generating a stable oscillation using an oscillator is disclosed. The method includes coupling a first end of a carbon nanotube to an amplifier. The method includes applying a voltage to the amplifier. The method includes stabilize the oscillator circuit with a resonance at a particular frequency.

BRIEF DESCRIPTION OF THE DRAWINGS

A full and enabling disclosure of the present disclosure directed to one of ordinary skill in the art, is set forth in the specification, which makes reference to the appended figures.

DETAILED DESCRIPTION

Figure 1:
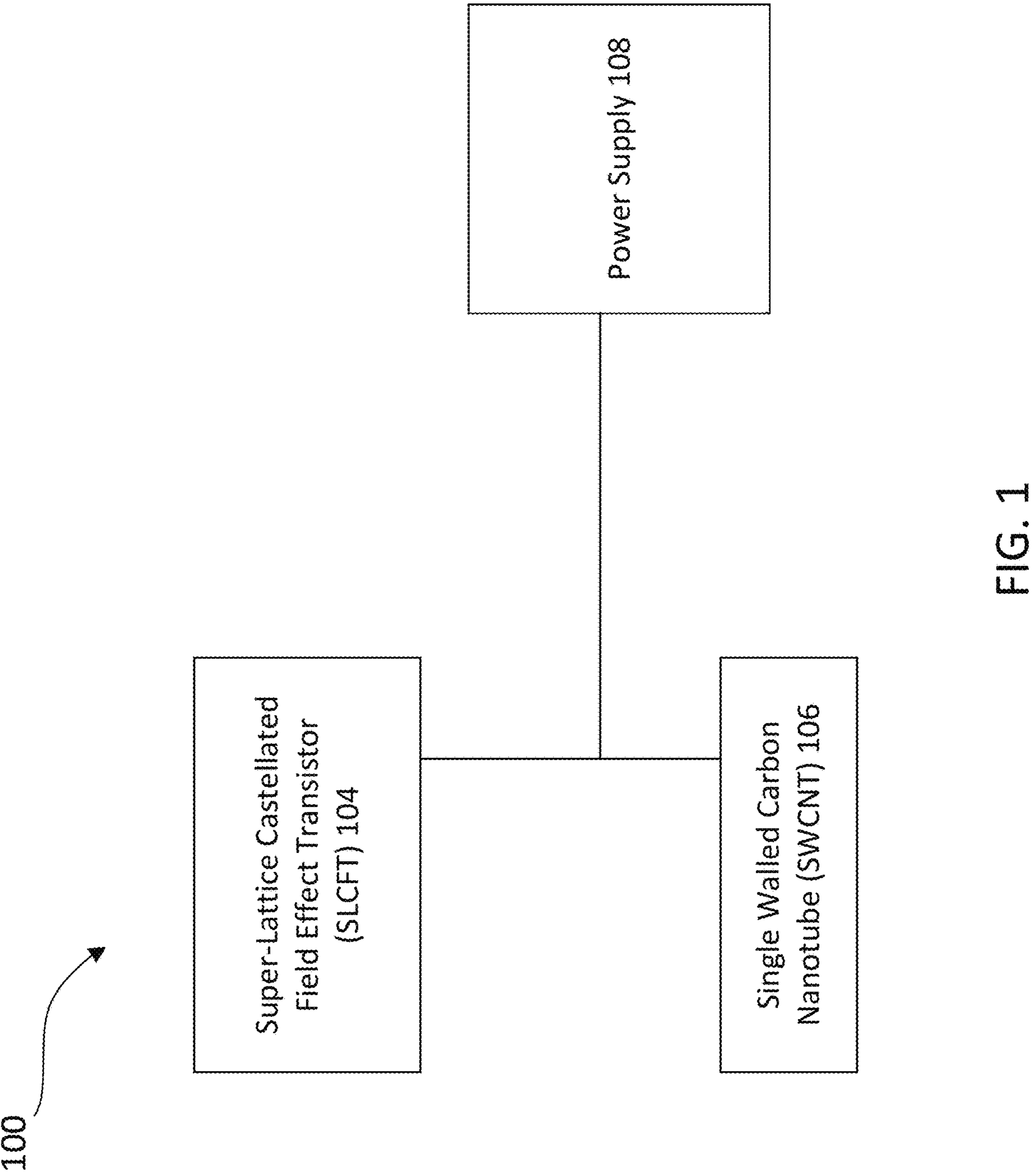
FIG. 1 shows an example oscillator, according to some embodiments.

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part of one embodiment can be used with another embodiment to yield a still further embodiment. Thus, it is intended that the present disclosure covers such modifications and variations as come within the scope of the appended claims and their equivalents.

Oscillators also need a frequency-selective element, or resonator; the two important pieces are the resonator and the amplifier. In a crystal-based oscillator, the frequency-selective element is a quartz crystal. In our invention, the frequency-selective element is a carbon nanotube (CNT).

CNTs possess remarkable physical and electrical properties, making them promising for a wide range of applications, including nanoelectronics, sensors, and high-frequency resonators. As describe herein, CNTs can serve as ultra-small resonators that can vibrate at specific frequencies and which could be used in advanced wireless communication, signal processing, and quantum computing.

A CNT resonator can include a carbon nanotube suspended from a single fixed point, like a cantilever. A power supply 108 or other power source can apply an electric voltage, which generates an electrical wave signal. In some embodiments, the CNT may generate electrical signals if the CNT serves as a resonator. In such embodiments, the electrons can travel from end to end of the CNT. For example, if one end of the CNT is open (e.g., unattached), then the open end can serve as a reflector, causing the electrons to travel back and forth within the CNT.

In some embodiments, CNTs can be incorporated into and/or coupled to transistors. For example, CNTs may serve as channels of and/or be coupled to a field-effect transistor (FET). Such embodiments can allow CNT-based resonators to provide improvements in wireless communication, nanoscale sensing, and even quantum technologies.

CNTs coupled with FETs can allow for millimeter-wave (mmWave) technologies that use high-performance resonant structures capable of efficiently confining and manipulating electromagnetic waves in the 30 GHz to 300 GHz frequency range. As described herein, some embodiments can include super-lattice castellated field effect transistors (SLCFETs). Such embodiments can achieve signals greater than 300 GHz and even greater than 500 GHz. Such resonators can be valuable components in wireless communication systems (e.g., 5G, 6G), high-resolution radar imaging, terahertz spectroscopy, and/or quantum devices. The unique one-dimensional electron transport properties of CNTs can significantly reduce surface resistance, leading to higher quality factors (Q-factors) and improved energy confinement at mmWave frequencies.

In some embodiments, CNTs can be used as a resonant cavity. A resonant cavity can include a structure configured to select electromagnetic waves at specific resonant frequencies. CNT-based cavities can make use of nanostructured material properties to improve field localization and minimize dissipation losses.

A subset of CNTs includes single-walled carbon nanotubes (SWCNTs). SWCNTs are uniquely useful in resonators and oscillators. Structurally, SWCNTs can include cylindrical nanostructures comprising a single graphene sheet rolled into a seamless tube, typically with a diameter of about 1-2 nm. Such an atomically precise structure can provide SWCNTs with an extremely high Young's modulus (~1 TPa) and intrinsic tensile strength. Thus SWCNTs can be used in embodiments described herein of ultra-high-frequency (UHF) and gigahertz-range (GHz) mechanical resonators with high stability and/or reduced energy dissipation. Their low mass and high stiffness can allow for even higher Q-factors.

In nanoelectromechanical systems (NEMS), the high surface-to-volume ratio of SWCNTs provide for effective electrical transport, allowing for efficient electrostatic or electromechanical actuation in oscillator configurations. SWCNT resonators can be tuned via external electric fields, mechanical strain, and/or environmental factors. Due to their one-dimensional structure, SWCNTs exhibit strong coupling to their surroundings, allowing for real-time modulation of their resonant frequency. This can make them highly adaptable for tunable frequency generation in RF circuits, advanced timing devices, and/or ultra-sensitive molecular detection systems. In some embodiments, quantum mechanical effects of SWCNTs, such as quantized phonon modes and/or electron-phonon interactions, can allow for quantum sensing and/or computing applications where ultra-high-frequency oscillations are used.

Reference will now be made to the figures. FIG. 1 shows an example oscillator 100, according to some embodiments. The oscillator 100 can include a SLCFET 104, a SWCNT 106, and/or a power supply 108. The SLCFET 104 can be an amplifier for the oscillator 100. Additionally or alternatively, the SWCNT 106 can form a resonant cavity for generating resonant waves.

The SWCNT 106 can be seeded by a catalyst and grown in a desired direction, such as parallel to a substrate. Additionally or alternatively, the SWCNT 106 can be grown to extend from a portion of the SLCFET 104 (e.g., at a drain of the SLCFET 104). The SWCNT 106 may be cantilevered from one or more portions of the SLCFET 104. However, the invention is not limited to any particular method for growing SWCNT 106.

A bias voltage can be applied to the circuit via the power supply 108. The voltage will induce a resonance at the SWCNT 106 at a selected frequency. This stabilizes the oscillation of a time-varying electric field, inducing an oscillating current between the SLCFET 104 and the SWCNT 106. The frequency of oscillation of this current can reach the resonant frequency of the SWCNT 106. This can allow the oscillator 100 to achieve high-Q and gain characteristics. The oscillator 100 can operate at frequencies ranging from 100 MHz to 500 GHz.

When the circuit uses a FET 204 (e.g., a SLCFET), with a switching speed of at least 500 GHz, for example, then stable oscillations of at least 500 GHz can be achieved.

Figure 2:
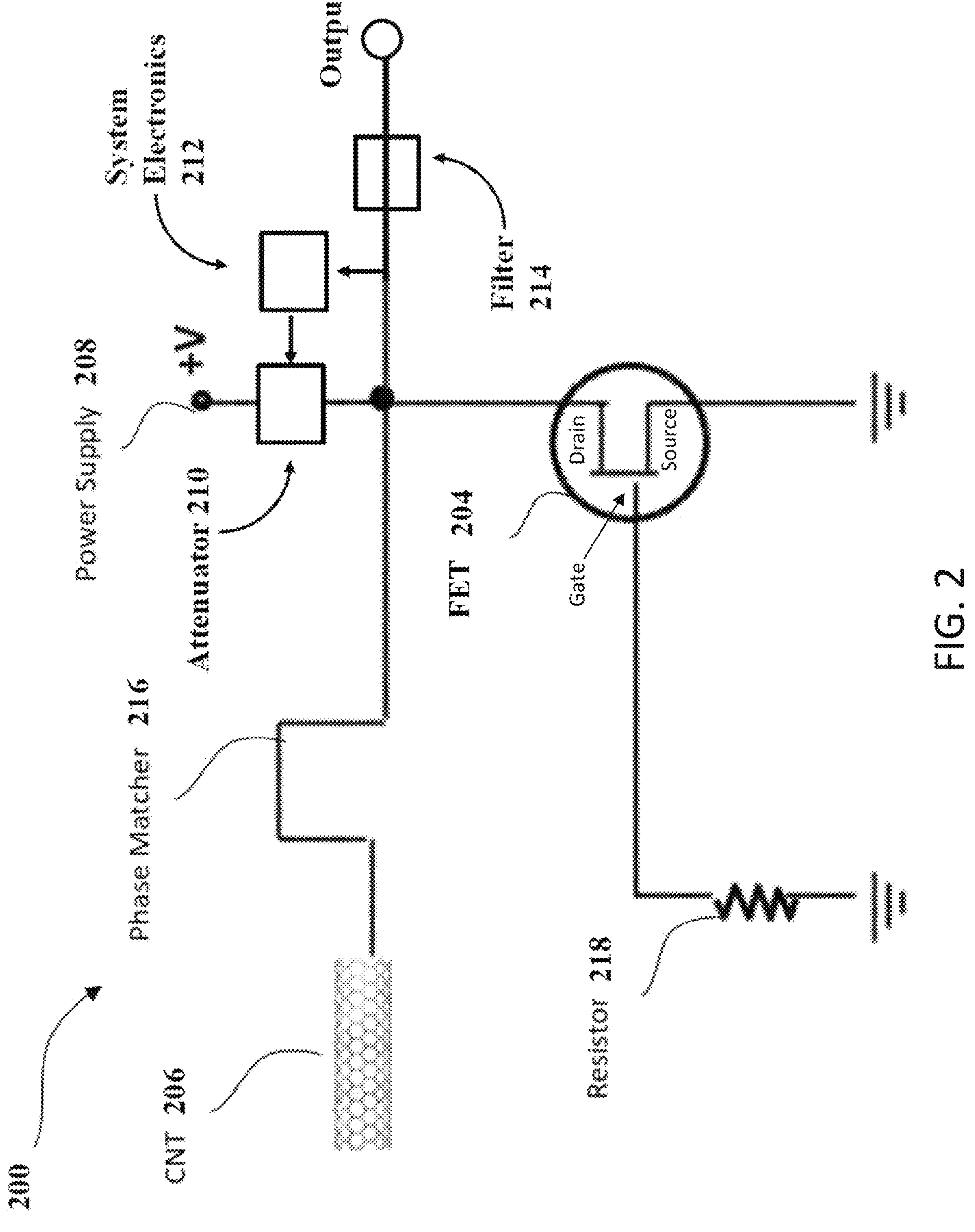
FIG. 2 shows an example oscillator that includes a carbon nanotube as a stable resonator, or a frequency-selective element, according to some embodiments.

FIG. 2 shows an example oscillator 200 that includes a carbon nanotube (CNT) 206 as a stable resonator, or a frequency-selective element, according to some embodiments. The oscillator 200 can include one or more elements of the oscillator 100 described above. The CNT 206 can generate a resonating electric field and may not require mechanical deformation of the CNT 206. For example, the CNT 206 can generate a resonant frequency using an open-ended CNT 206. Because the resonance is an electric field, and because carbon nanotubes are known to allow extremely fast electron transport, much higher resonant frequencies are achievable in the CNT 206.

The CNT 206 can be open on one end. Rather than relying on electric transducers on one or both ends, in some embodiments the CNT 206 resonates by reflecting the electromagnetic field at both ends, which can generate a standing wave of a target frequency. In such embodiments, the reflection happens on one side because the CNT 206 is left open (e.g., generating a full reflection), and/or on the other side by the inherent impedance mismatch at the coupling between the CNT 206 and the FET 204. Such an imperfect impedance mismatch can generate a back reflection.

In some embodiments where the CNT 206 is open on one end, the circuit may not feed back an amplified signal in a beneficial way. In some embodiments, the CNT 206 can be arranged with the FET 204 to achieve a negative resistance mode. For example, to overcome losses within the CNT 206 and at its coupling with the FET 204, the oscillator 200 can be used in the negative-resistance mode. For example, in negative-resistance mode the direction of current in the FET 204 (e.g., SLCFET) can reverse with an increase in voltage, so that current direction oscillates at the frequency selected by the CNT 206. This increase may be temporary. For example, the increase in voltage in the CNT 206 may last a few nanoseconds. Additionally or alternatively, in response to a change in the voltage at the FET 204, negative resistance may be achieved.

Negative resistance can be used in higher- and lower-frequency oscillators, for example to compensate for a damping of a resonator. Operating the oscillator 200 in a negative-resistance mode can mean that an AC component of the current can be made to flow in a reverse direction, such that an oscillation about a mean voltage can be established. The CNT 206 in such embodiments can maintain a stability of the frequency of that oscillation.

Negative resistance can occur when an increase in voltage across a component leads to a decrease in current, creating a region in the current-voltage characteristic where resistance is effectively negative. Negative resistance may be used in the oscillator 200 to counteract oscillation losses, which can increase stability of the resonant oscillations. For example, in oscillator 200, negative resistance can be leveraged to stabilize an oscillation between the CNT 206 and the FET 304. A resistor 218 may be included at the gate of the FET 204 to help ensure that negative resistance is achieved.

In some embodiments, a phase-matching element may be included to help ensure that the field returning to the CNT 206 is in phase with the resonance within the CNT 206. This may be achieved, for example, by using a phase matcher 216, which may include a delay line and/or a varactor diode. As shown in FIG. 2, the phase matcher 216 can include a delay line. The delay line can be configured to provide phase matching. The phase matcher 216 can be coupled between the SLCFET and the SWCNT. Additionally or alternatively, the phase matcher 216 can modify a phase of waves passing between the FET 204 and the CNT 206.

In some examples, the CNT 206 can serve as a frequency-selective element. The length of the CNT 206 can determine which frequencies can be resonant. For example, if the CNT 206 is 500 nm long, a resonance of up to 1 THz can be achieved.

The CNT 206 can form a cavity resonator. The CNT 206 can include a SWCNT and/or may include one or more features of the SWCNT 106 described above. The resonator formed by the CNT 206 can be in series with the FET 204, which can serve as an amplifier. The CNT 206 can generate a reflection due to an impedance mismatch between CNT 206 and the FET 204. The oscillator 200 can generate a standing wave in the CNT 206. Because a CNT 206 can support single-mode transmission, and because the oscillator 200 need not rely on a sizing and/or control of a feedback loop to maintain phase matching, a stable and extremely-high-frequency reference source can be achieved.

The length of the CNT 206 can be relatively short, which can allow for high frequency wave generation. For a length of the CNT 206 being around 500 nm, the oscillator 200 can transmit power oscillation on the order of 100s of GHz. Transfer and/or placement of CNT 206 described herein can allow for oscillations of greater than GHz. For example, the placement of the CNT 206 can be within nanometers of its target location to allow for proper coupling with the fast FET 204. The FET 204 can include a SLCFET. The FET 204 can include one or more features of the SLCFET 104 described above.

A frequency reference can be based on a voltage-controlled oscillator (VCO). A VCO can include, for example, an electronic oscillation about an amplifier in a phase-locked loop (PLL). The VCOs (e.g., in the form of crystal-stabilized oscillators) in microprocessors can generate several GHz. The oscillator 100 can be configured to generate waves having frequencies greater than about 1 GHz, greater than about 5 GHz, greater than about 10 GHZ, greater than about 20 GHz, greater than about 30 GHz, greater than about 50 GHZ, greater than about 100 GHz, greater than about 250 GHz, greater than about 500 GHz, any value therein, or fall within a range having endpoints therein. For example, in some embodiments, the frequencies generated may be greater than 10 GHz.

The oscillator 200 can generate and/or use a high-frequency feedback loop. The oscillation can include a standing wave within the CNT 206. As shown in FIG. 2, the CNT 206 can be fed by the power supply 208, which can include a DC voltage source. The amplitude of the voltage from the power supply 208 can be attenuated by a lower frequency feedback. A standing wave, or resonance, can be generated via back reflection of power due to an impedance mismatch between the CNT 206 and the FET 204 (e.g., at a coupling point between the two).

Dispersion of the transmitted and/or modulated signal can be relatively small. For example, the CNT 206 can support single-mode transmission. In some embodiments, a high-frequency feedback loop may not be required. The feedback loop may include a phase-locked loop (PLL). In some embodiments, a PLL is not included. In a PLL, the phase of the signal as it rotates about the amplifier can be a limiting factor in the frequencies generated. In some embodiments, the stability of the frequency generated may depend on (e.g., only on) a mechanical stability of the CNT 206.

In some embodiments, a filter 214, such as a bandpass filter, can be included in the oscillator 200. For example, the filter 214 may be disposed at an output of the oscillator 200. Such a bandpass filter can remove lower-power, higher-frequency modes of the cavity resonator. For example, the attenuator 210 can be may be included to manage the voltage supplied by the power supply 208.

The oscillator 200 can include one or more other components. For example, the oscillator 200 can include a variable attenuator 210 configured to modify an amplitude of the stable oscillation. The variable attenuator 210 can include an electronic component that allows controlled reduction of an amplitude of the signal without significantly distorting its waveform. The variable attenuator 210 can be included in the circuit to regulate the power of the circuit, in order to achieve stable oscillation.

The oscillator 200 can generate standing waves due to the interference between forward and reflected waves within the CNT 206 (e.g., the resonant cavity). The attenuator 210 can fine-tune oscillation amplitude to prevent excessive signal growth, which may otherwise lead to nonlinear distortion or damage to components of the oscillator 200.

The oscillator 200 can include system electronics 212. The system electronics 212 can include an integrator, a comparator, and/or a controller. An integrator in the oscillator 200 can be configured to integrate the oscillation over time, in order to manage how much voltage is supplied to the circuit, in order to improve oscillation stability. The integrator may be used to regulate the voltage amplitude for sustained oscillations without significant distortion. Thus, stable oscillation may be achieved.

In some embodiments, the oscillator 200 can include a comparator to monitor the amplitude of the output oscillation and/or compare it against a reference threshold. If the amplitude deviates from a target range, the comparator can generate a control signal that can cause the oscillator 200 to adjust one or more system parameters, such as attenuation. The control signal may prevent excessive signal buildup, which may otherwise lead to nonlinear behavior or instability. Additionally, in embodiments using a phase-locked loop (PLL), the comparator can help regulate the frequency by improving phase coherence between the oscillating signal and a reference input.

The controller can receive inputs from the comparator, integrator, and/or other components of the oscillator 200 to control signal attenuation, feedback, and/or frequency tuning. The controller can implement real-time instructions to improve stability and/or reduce unwanted characteristics described above. The controller can include a non-transitory memory and/or an electronic hardware processor configured to implement the actions described herein.

Figure 3:
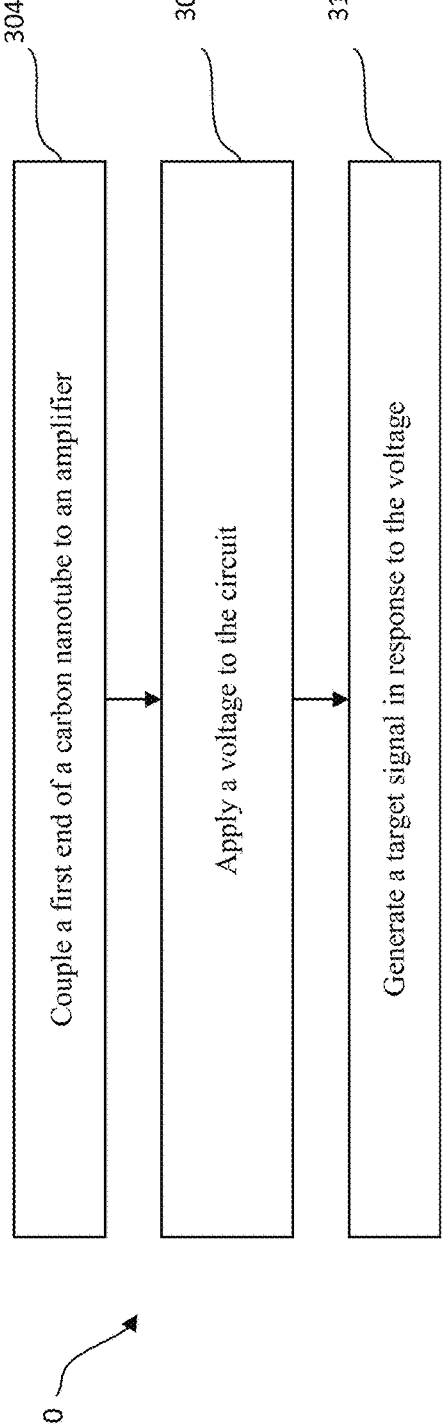
FIG. 3 illustrates an example method for generating a stable oscillation using an oscillator.

FIG. 3 illustrates an example method 300 for generating a stable oscillation (e.g., at a target frequency) using an oscillator (e.g., the oscillator 100, the oscillator 200). The steps may be performed by any system or part of a system described herein. It is to be understood and appreciated that the method of FIG. 3 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 304, the method 300 includes coupling a first end of a carbon nanotube to an amplifier. At 308, the method 300 includes applying a voltage to the circuit (e.g., at the amplifier). At 312, the method 300 includes generating a stable oscillation in response to the voltage. In some embodiments, the method 300 includes achieving a negative resistance. For example, in response to an increase in voltage at the amplifier, an increase in current occurs at the carbon nanotube. In some embodiments, the method 300 includes modifying a phase and/or amplitude of waves passing from the amplifier to the carbon nanotube. In some embodiments, the method 300 includes generating standing waves within the carbon nanotube. In some embodiments, the method 300 includes removing waves having a frequency smaller than a threshold minimum frequency (e.g., 10 GHz).

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

This written description uses examples to disclose various embodiments and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An oscillator configured to output a stable oscillation, the oscillator comprising:

a super-lattice castellated field effect transistor (SLCFET) comprising a drain;

a single-walled carbon nanotube (SWCNT) extending along a resonance axis, a first end of the SWCNT along the resonance axis being open, a second end of the SWCNT along the resonance axis operably coupled to the drain of the SLCFET; and a power supply configured to apply a voltage to the oscillator to generate the stable oscillation.

2. The oscillator of claim 1, wherein in response to an increase in the voltage at the SLCFET, a current within the SWCNT is increased.

3. The oscillator of claim 1, wherein in response to a change in the voltage at the SLCFET, negative resistance is achieved.

4. The oscillator of claim 1, wherein the oscillator is configured to generate a stable resonance having frequencies greater than 10 GHz.

5. The oscillator of claim 1, further comprising a bandpass filter configured to remove oscillations having a frequency smaller than 10 GHz.

6. The oscillator of claim 1, further comprising a phase matcher coupled between the SLCFET and the SWCNT, the phase matcher configured to modify a phase of waves passing from the SLCFET to the SWCNT.

7. The oscillator of claim 1, wherein a length of the SWCNT is configured to generate standing waves within the SWCNT.

8. The oscillator of claim 7, wherein the length of the SWCNT is less than 1 micron.

9. The oscillator of claim 1, further comprising a variable attenuator configured to modify a voltage applied to the oscillator.

10. An oscillator configured to output a stable oscillation, the oscillator comprising:

an amplifier;

a carbon nanotube (CNT) extending along a resonance axis, a first end of the CNT along the resonance axis being open, a second end of the CNT along the resonance axis operably coupled to the amplifier, the CNT configured to generate a stable oscillation in response to a voltage; and a power supply configured to apply the voltage to the oscillator.

11. The oscillator of claim 10, wherein the CNT comprises a single-walled CNT (SWCNT).

12. The oscillator of claim 10, wherein the amplifier comprises a field-effect transistor (FET).

13. The oscillator of claim 10, wherein in response to an increase in the voltage at the amplifier, a current through the CNT is increased.

14. The oscillator of claim 10, wherein in response to a change in the voltage at the amplifier, negative resistance is achieved.

15. The oscillator of claim 10, wherein the oscillator is configured to generate stable oscillations having frequencies greater than about 50 GHz.

16. The oscillator of claim 10, further comprising a bandpass filter configured to remove oscillations having a frequency smaller than 10 GHz.

17. The oscillator of claim 10, further comprising a phase matcher coupled between the amplifier and the CNT, the phase matcher configured to modify a phase of waves passing from the amplifier to the CNT.

18. The oscillator of claim 10, wherein a length of the CNT is configured to generate standing waves within the CNT.

19. The oscillator of claim 18, wherein the length of the CNT is less than 1 micron.

20. The oscillator of claim 10, further comprising a variable attenuator configured to modify the voltage applied to the oscillator.

* * * * *